(12) United States Patent
Aikawa et al.

(10) Patent No.: US 7,917,347 B2
(45) Date of Patent: Mar. 29, 2011

(54) GENERATING A WORST CASE CURRENT WAVEFORM FOR TESTING OF INTEGRATED CIRCUIT DEVICES

(75) Inventors: Makoto Aikawa, Tokyo (JP); Jonathan J. DeMent, Austin, TX (US); Sang H. Dhong, San Jose, CA (US); Brian K. Flachs, Georgetown, TX (US); Gilles Gervais, Austin, TX (US); Iwao Takiguchi, Tokyo (JP); Tetsuji Tamura, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 710 days.

(21) Appl. No.: 11/927,840

(22) Filed: Oct. 30, 2007

(65) Prior Publication Data

US 2009/0112550 A1    Apr. 30, 2009

(51) Int. Cl.
*G06F 17/50*    (2006.01)

(52) U.S. Cl. .......................................................... 703/14
(58) Field of Classification Search ...................... 703/14
See application file for complete search history.

(56) References Cited

U.S. PATENT DOCUMENTS

| | | | |
|---|---|---|---|
| 5,210,820 A * | 5/1993 | Kenyon | 704/200 |
| 6,424,022 B1 | 7/2002 | Wu et al. | |
| 7,039,536 B2 | 5/2006 | Nagata et al. | |
| 2002/0147555 A1 | 10/2002 | Nagata et al. | |
| 2002/0164851 A1 | 11/2002 | Wu et al. | |
| 2005/0188230 A1 | 8/2005 | Bilak | |
| 2008/0189090 A1 | 8/2008 | Aikawa et al. | |

OTHER PUBLICATIONS

Advanced Micro Devices, "AMD-K6E", Jan. 1999, Advanced Micro Devices, pp. 1-10.*
Toshio Murayama et al., "Estimation of peak current through CMOS VLSI circuit supply lines", 1999, Design Automation Conference 1999, pp. 295-298.*
MicroSim Corporation, "MicroSim PSpice & Basics", 1997, MicroSim Corporation, pp. 9-9 through 9-14.*
Hooman Darabi et al., "Noise in RF-CMOS Mixers: a simple physical model", 2000, IEEE Transactions on Solid State Circuits, vol. 35, No. 1, pp. 15-25.*
Harish Kriplani et al., "Pattern Independent Maximum Current Estimation in Power and Ground Buses of CMOS VLSI Circuits; Algorithms, Signal Correlations, and Their Resolution", 1995, IEEE Transactions on Computer-Aided Design of Integrated Circuits and Systems, vol. 14, No. 8, pp. 998-1012.*

(Continued)

*Primary Examiner* — Paul L Rodriguez
*Assistant Examiner* — Russ Guill
(74) *Attorney, Agent, or Firm* — Stephen J. Walder, Jr.; Matthew B. Talpis

(57) ABSTRACT

Mechanisms for generating a worst case current waveform for testing of integrated circuit devices are provided. Architectural analysis of an integrated circuit device is first performed to determine an initial worst case power workload to be applied to the integrated circuit device. Thereafter, the derived worst case power workload is applied to a model and is simulated to generate a worst case current waveform that is input to an electrical model of the integrated circuit device to generate a worst case noise budget value. The worst case noise budget value is then compared to measured noise from application of the worst case power workload to a hardware implemented integrated circuit device. The worst case current waveform may be selected for future testing of integrated circuit devices or modifications to the simulation models may be performed and the process repeated based on the results of the comparison.

20 Claims, 8 Drawing Sheets

OTHER PUBLICATIONS

Angela Krstic et al., "Vector generation for maximum instantaneous current through supply lines for CMOS circuits", 1997, Design Automation Conference, six unnumbered pages.*

Yi-Min Jiang et al., "Estimation of maximum power supply noise for deep sub-micron designs", 1998, Proceedings of the International Symposium on Low Power Electronics and design, pp. 233-238.*

Frantz et al., "Push performance and power beyond the data sheet", CMP Media LLC, Power Management DesignLine, 2006, http://www.powermanagementdesignline.com/howto/newpowerplays/188101596, 6 pages.

USPTO U.S. Appl. No. 11/671,852, 1 page.

* cited by examiner

GENERATING A WORST CASE CURRENT WAVEFORM FOR TESTING OF INTEGRATED CIRCUIT DEVICES

BACKGROUND

1. Technical Field

The present application relates generally to an improved data processing system and method. More specifically, the present application is directed to a system and method for generating a worst case current waveform for testing of integrated circuit devices.

2. Description of Related Art

The performance and power dissipation of an integrated circuit device depends on multiple factors. For example, operating temperature, the process used to fabricate the integrated circuit device, and operating voltage all affect how the integrated circuit device will perform and the power that the integrated circuit device dissipates. Performance tends to vary with process linearly, varies with operating temperature in an inverse logarithmic relationship, and varies with operating voltage exponentially. Power dissipation tends to vary with process somewhat linearly, with operating temperature exponentially, and with operating voltage exponentially. With these relationships, it can be seen that it is important in the design of modern integrated circuit devices to determine the lowest supply voltage, i.e. VminF, in order to guarantee that the integrated circuit device will function with the least power dissipation.

Typically, in order to determine the lowest supply voltage, worst case current waveforms (di/dt) are usually used to test an integrated circuit device, where di/dt represents the change in current over time. The determination of the worst case current waveforms (di/dt) is typically left to a human designer's educated determination of the workload on the integrated circuit device which will cause the most power consumption. Since it is left to the human designer to determine this worst case current waveform, human error may be present in this determination.

In order to ensure that the integrated circuit device will support the worst case operating scenario, i.e. the worst case current waveform, a guard band is typically added to the empirically determined minimum supply voltage VminF. The guard band is typically estimated based on the human designer's educated extrapolation of the results obtained during testing of the integrated circuit device. Thus, there may be considerable uncertainty in the estimation of the guard band to apply to the empirically determined minimum supply voltage VminF, as well as the uncertainty in the determination of the worst case current waveform.

SUMMARY

In view of the above, it would be beneficial to have a system and method for determining a guard band for the minimum supply voltage of an integrated circuit device that significantly reduces the uncertainty in the determination of the guard band. One way in which to reduce uncertainty is to provide greater confidence in the determination of the worst case current waveform used to test the integrated circuit device. A system and method for generating a worst case current waveform for testing of integrated circuit devices is provided by the illustrative embodiments herein, as well as a system and method for the determination of a guard band, such that the uncertainty in generating the worst case current waveform and the guard band are reduced.

With the mechanisms of the illustrative embodiments, architectural analysis and characterization of an integrated circuit device, such as a processor, chip, package, or the like, is first performed. This architectural analysis and characterization results in information regarding the instruction set and pipeline used by the integrated circuit device, for example.

From the architecture and device characterization information, either a human designer or an automated analysis tool determines an initial worst case power workload to be applied to the integrated circuit device. This worst case power workload may be determined as the workload that causes the most total power consumption, i.e. active power consumption due to transistor switching plus leakage power consumption. The worst case power workload is thus, a sequence of instructions that may be fed to the pipeline of the integrated circuit device that will cause the transistors in each of the stages of the pipeline to be activated, i.e. will cause a switching of the transistors and thus, an active power consumption. This set of instructions may further be mirrored with determined data patterns that will cause the states of latches in the pipeline to be flipped. This worst case power workload may be a combination of instructions and data that do not in fact provide any useful code sequence or data pattern, i.e. it would not generally be utilized during the lifetime of the integrated circuit device, but still provides a worst case approximation of the power consumption of the integrated circuit device.

After deriving a cycle-by-cycle worst case power workload, the mechanisms of the illustrative embodiments perform two branches of operation: a simulation branch, and an actual hardware test branch. In the simulation branch of operation, the derived worst case power workload is applied to a model, such as a hardware description language (HDL) model, register transfer level (RTL) model, or the like, of the integrated circuit device and the workload is simulated on the model. Transistor level switching factors for each cycle of the simulation of the integrated circuit device are obtained from the simulation and a power value for each cycle is derived from this transistor level switching factor. The power values are used to generate a current versus time waveform, i.e. the worst case current waveform, which is then output from the simulation.

The worst case current waveform derived from the simulation may be scaled by a scaling factor to account for input/output (I/O) related power consumption as well as various other unmodeled elements. Moreover, this scaling factor may be used to adjust the worst case current waveform to account for process variability in the manufacture of the integrated circuit device, the transistors (i.e. not all transistors consume the same amount of current when switched), and the like. The switching factor may be determined, for example, empirically through observation of discrepancies of previous simulation results with actual hardware operation, may be input by a user based on the user's own educated assessment, or the like.

The worst case current waveform is input to an electrical model of the integrated circuit device, such as a SPICE model or other electrical model, in order to determine the noise magnitude associated with the worst case current waveform. The simulation of the worst case current waveform with the electrical model of the integrated circuit device provides information regarding how the voltage on the integrated circuit device varies over time at the power input to the integrated circuit device. A worst case noise budget value may then be selected based on the noise magnitude generated by the running of the worst case current waveform on the electrical model. This selected budget value is then used to compare against actual noise measurements of the hardware under the worst case power workload to determine if the worst case current waveform provides satisfactory simulation of the actual integrated circuit device.

For example, along the second branch, i.e. the hardware test branch, the worst case power workload is run on the actual hardware of the integrated circuit device. The noise experienced by the hardware due to the worst case power workload is measured using a current meter, high-speed oscilloscope, or the like. The current and voltage fluctuations over time may be observed using this test equipment and the resulting measured noise may be compared to the noise budget value selected based on the simulated noise values.

If the measured noise is within a tolerance of the noise budget, such as within 1 or 2 percent of the noise budget, for example, then the noise associated with the noise budget is compared with system specifications for low/mid/high/composite frequency integrated circuit device noise. If the noise associated with the noise budget is within a tolerance of the specification noise, then the worst case power workload and worst case current waveform are determined to provide an accurate representation of the actual integrated circuit device under worst case workload conditions. If the noise associated with the noise budget is not within a tolerance of the specification noise, then the process may be repeated in order to obtain a new worst case power workload and worst case current waveform.

If the measured noise is not within the tolerance of the noise budget, then various modifications to improve the models used during simulation may be performed. Moreover, the switching factor and scaling factors may be adjusted to attempt to obtain a better approximation of the worst case current waveform and calculation of noise for comparison to the measured noise from the run of the worst case power workload on the hardware of the integrated circuit device. The adjustments may be made in a subsequent iteration of the above process which may be iterated as many times as necessary to achieve a good approximation of the worst case current waveform for testing purposes.

Once the worst case current waveform is determined, the illustrative embodiments provide a mechanism for calculating the guard band based on a comparison of simulated noise obtained from a simulation of the integrated circuit device using the worst case current waveform stimuli with simulated or measured power supply noise of a workload/test pattern that may be achieved using testing equipment. A scaling factor k for the guard band is determined by comparing results of a simulation of a workload/test pattern with measured results of the workload/test pattern as applied to a hardware implementation of the integrated circuit device, i.e. k=measured_noise/simulated_noise.

In one illustrative embodiment, this scaling factor k is applied to a difference between the noise generated through simulation of the workload/test pattern and the noise generated through simulation of the worst case current waveform to generate a guard band value, i.e. a VminF voltage offset (VVO). In other words, the VVO is defined using the following equation: $VVO = k*(Noise_{Vsim\_testpattern} - Noise_{Vsim\_worst\_case})$. The resulting guard band defined by VVO is applied to the minimum supply voltage VminF determined from application of the specific workload/test pattern to the integrated circuit device, in order to obtain the real minimum supply voltage condition. Thereby, the minimum operating voltage for the integrated circuit device that achieves the least power dissipation may be determined and used with the integrated circuit device.

In one illustrative embodiment, a method for determining a worst case current waveform for testing an integrated circuit device is provided. The method may comprise generating a worst case power workload for the integrated circuit device, simulating the worst case power workload on a primitive level model of the integrated circuit device to generate a worst case current waveform, and simulating the worst case current waveform on an electrical model of the integrated circuit device to generate a worst case noise value. The method may further comprise measuring actual noise of the integrated circuit device running the worst case power workload, comparing the actual noise to the worst case noise value, and selecting, based on results of the comparison, the worst case current waveform for use in testing integrated circuit devices if the actual noise is within a tolerance of the worst case noise value. The worst case noise value may be a worst case noise budget value derived from a noise magnitude value generated by simulating the worst case current waveform on the electrical model of the integrated circuit device.

Generating a worst case power workload for the integrated circuit device may comprise performing an architectural analysis of the primitive level model that simulates transistors of the integrated circuit device and deriving, as the worst case power workload, a sequence of instructions that cause the integrated circuit device to consume a maximum amount of power when executed by the integrated circuit device, based on the architectural analysis. Performing an architectural analysis of the primitive level model may further comprise analyzing an issue unit state machine of the integrated circuit device to derive at least one situation in which all pipeline stages of a pipeline of an execution unit in the integrated circuit device are utilized at a same time and determining which portions of the execution unit consume the most power under the at least one situation by running valid instructions through the pipeline and analyzing results of running the valid instructions, wherein the sequence of instructions is derived based on the results of running the valid instructions.

Generating a worst case power workload for the integrated circuit device may further comprise creating one or more data patterns to accompany the sequence of instructions, the one or more data patterns providing maximum switching of the transistors of an execution unit when the sequence of instructions is executed by the integrated circuit device. Generating a worst case power workload for the integrated circuit device may also comprise adjusting the sequence of instructions to generate a sequence of instructions having a corresponding sequence of power consumption peaks and valleys that match fundamental noise harmonics of the integrated circuit device.

Simulating the worst case power workload on an primitive level model of the integrated circuit device to generate a worst case current waveform may comprise generating switching factor information for each cycle of the simulation, generating a power consumption value for each cycle of the simulation based on the switching factor information and an average transistor power consumption per switching event value, and generating the worst case current waveform based on the power consumption value for each cycle of the simulation.

The method may further comprise scaling the worst case current waveform using a scaling factor to account for at least one of input/output related power consumption or process variability in formation of transistors. The method may also comprise modifying at least one of an architecture of the primitive level model, assumptions of noise parasitics in the electrical model, a transistor power consumed per switching operation value used to generate the worst case current waveform, or a scaling factor used to generate the worst case current waveform and repeating the steps of the method following the modification. The steps of the method may be repeated for each of a plurality of operational frequency ranges of the integrated circuit device.

In other illustrative embodiments, a computer program product comprising a computer useable medium having a computer readable program is provided. The computer readable program, when executed on a computing device, causes the computing device to perform various ones, and combinations of, the operations outlined above with regard to the method illustrative embodiment.

In yet another illustrative embodiment, an apparatus is provided. The apparatus may comprise a processor and a memory coupled to the processor. The memory may comprise instructions which, when executed by the processor, cause the processor to perform various ones, and combinations of, the operations outlined above with regard to the method illustrative embodiment.

These and other features and advantages of the present invention will be described in, or will become apparent to those of ordinary skill in the art in view of, the following detailed description of the exemplary embodiments of the present invention.

BRIEF DESCRIPTION OF THE DRAWINGS

The invention, as well as a preferred mode of use and further objectives and advantages thereof, will best be understood by reference to the following detailed description of illustrative embodiments when read in conjunction with the accompanying drawings, wherein.

DETAILED DESCRIPTION OF THE ILLUSTRATIVE EMBODIMENTS

The illustrative embodiments provide a mechanism for determining worst case current waveform for testing an integrated circuit device, such as a processor, chip, package, or the like, in order to obtain a guard band for an operating voltage of an integrated circuit device, such as an integrated circuit chip. The worst case current waveform is determined through a combination of simulation and hardware measurement of the integrated circuit device in order to obtain a worst case current waveform that accurately represents the actual hardware processing of a worst case power workload.

Having obtained a worst case current waveform through operation of the illustrative embodiments, a guard band may be generated for the integrated circuit device based on the worst case current waveform. The guard band may be added to a minimum operating voltage determined through simulation and/or testing of the integrated circuit device in order to identify a worst case supply voltage for the integrated circuit device. In this way, the lowest supply voltage VminF of the integrated circuit device that provides the least power dissipation may be identified. The integrated circuit device may then be operated using a supply voltage determined based on this lowest supply voltage VminF identified using the mechanisms of the illustrative embodiments.

The illustrative embodiments may be implemented in a single data processing system or may be distributed across a plurality of data processing systems that are coupled to one another via one or more communications networks. For example, a server computing device may provide circuit model simulation and analysis engines that may be applied to integrated circuit designs or models provided by other computing devices, such as client computing devices. A client computing device may communicate with the server computing device via the one or more communications networks so as to control the application of simulation and analysis engines of the illustrative embodiments to the integrated circuit models, which may be provided, for example, as netlist data structures, hardware description language files, or the like. Alternatively, the integrated circuit models and analysis engines may be provided entirely on the same computing device such that multiple computing devices and communication networks are not necessary. For purposes of the present description, however, it will be assumed that the illustrative embodiments are implemented in a distributed data processing system.

Figure 1:
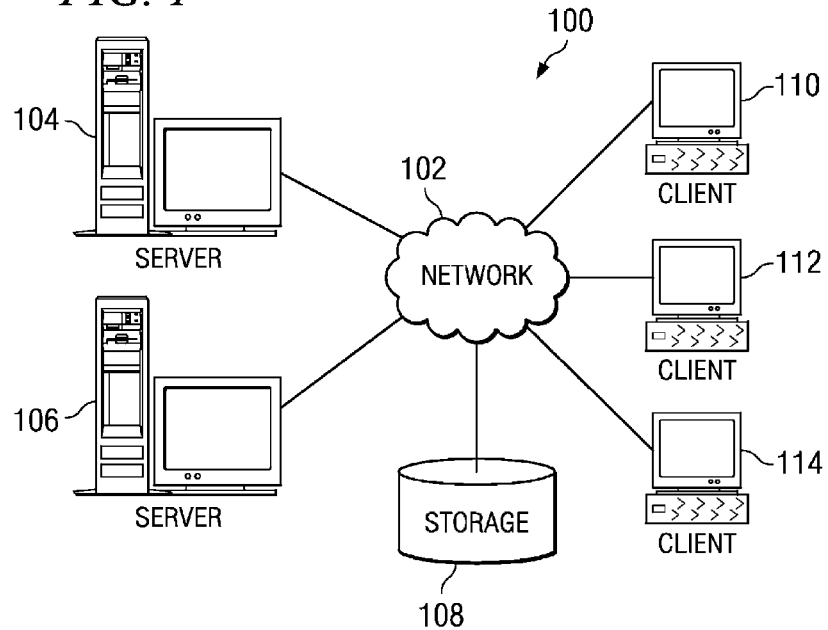
FIG. 1 is an exemplary block diagram of a distributed data processing system in which aspects of the illustrative embodiments may be implemented.
Figure 2:
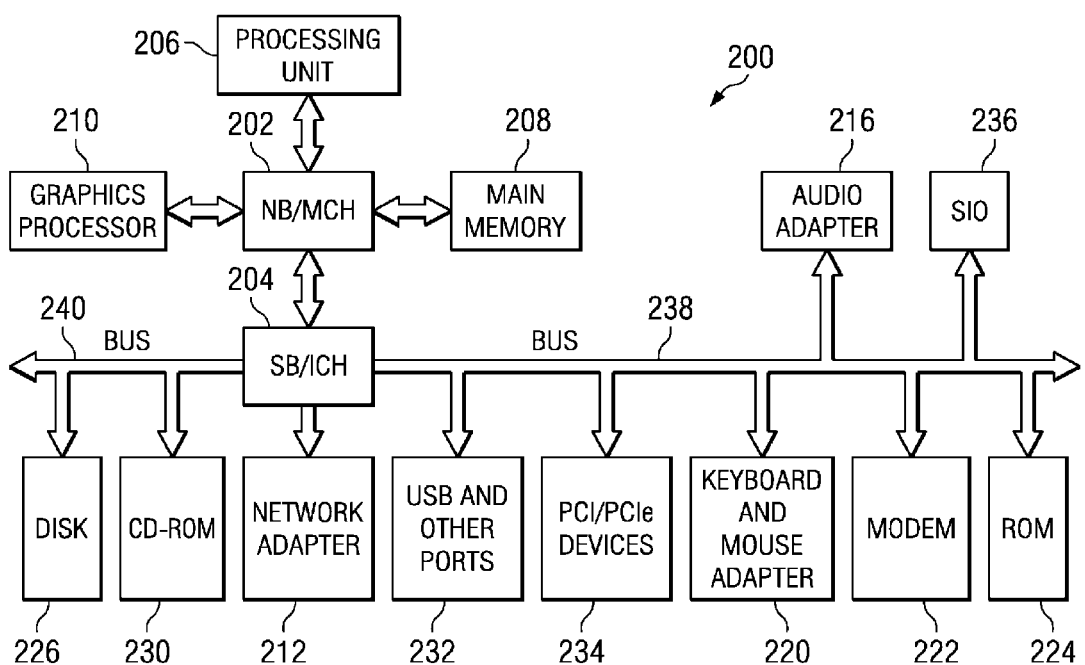
FIG. 2 is a block diagram of an exemplary data processing device in which exemplary aspects of the illustrative embodiments may be implemented.

With reference now to the figures and in particular with reference to FIGS. 1-2, exemplary diagrams of data processing environments are provided in which exemplary embodiments of the present invention may be implemented. It should be appreciated that FIGS. 1-2 are only exemplary and are not intended to assert or imply any limitation with regard to the environments in which aspects or embodiments of the present invention may be implemented. Many modifications to the depicted environments may be made without departing from the spirit and scope of the present invention.

FIG. 1 is a diagram of an exemplary distributed data processing system in which aspects of the illustrative embodiments may be implemented. Distributed data processing system 100 may include a network of computers in which embodiments of the illustrative embodiments may be implemented. The distributed data processing system 100 contains at least one network 102, which is the medium used to provide communication links between various devices and computers connected together within distributed data processing system 100. The network 102 may include connections, such as wire, wireless communication links, or fiber optic cables.

In the depicted example, server 104 and server 106 are connected to network 102 along with storage unit 108. In addition, clients 110, 112, and 114 are also connected to network 102. These clients 110, 112, and 114 may be, for example, personal computers, network computers, or the like. In the depicted example, server 104 provides data, such as boot files, operating system images, and applications to the clients 110, 112, and 114. Clients 110, 112, and 114 are clients to server 104 in the depicted example. Distributed data processing system 100 may include additional servers, clients, and other devices not shown.

In the depicted example, distributed data processing system 100 is the Internet with network 102 representing a worldwide collection of networks and gateways that use the Transmission Control Protocol/Internet Protocol (TCP/IP) suite of protocols to communicate with one another. At the heart of the Internet is a backbone of high-speed data communication lines between major nodes or host computers, consisting of thousands of commercial, governmental, educational and other computer systems that route data and messages. Of course, the distributed data processing system 100 may also be implemented to include a number of different types of networks, such as for example, an intranet, a local area network (LAN), a wide area network (WAN), or the like. As stated above, FIG. 1 is intended as an example, not as an architectural limitation for different embodiments of the present invention, and therefore, the particular elements shown in FIG. 1 should not be considered limiting with regard to the environments in which the illustrative embodiments of the present invention may be implemented.

With reference now to FIG. 2, a block diagram of an exemplary data processing system is shown in which aspects of the illustrative embodiments may be implemented. Data processing system 200 is an example of a computer, such as server 104 or client 110 in FIG. 1, in which computer usable code or instructions implementing the processes for illustrative embodiments of the present invention may be located.

In the depicted example, data processing system 200 employs a hub architecture including north bridge and memory controller hub (NB/MCH) 202 and south bridge and input/output (I/O) controller hub (SB/ICH) 204. Processing unit 206, main memory 208, and graphics processor 210 are connected to NB/MCH 202. Graphics processor 210 may be connected to NB/MCH 202 through an accelerated graphics port (AGP).

In the depicted example, local area network (LAN) adapter 212 connects to SB/ICH 204. Audio adapter 216, keyboard and mouse adapter 220, modem 222, read only memory (ROM) 224, hard disk drive (HDD) 226, CD-ROM drive 230, universal serial bus (USB) ports and other communication ports 232, and PCI/PCIe devices 234 connect to SB/ICH 204 through bus 238 and bus 240. PCI/PCIe devices may include, for example, Ethernet adapters, add-in cards, and PC cards for notebook computers. PCI uses a card bus controller, while PCIe does not. ROM 224 may be, for example, a flash binary input/output system (BIOS).

HDD 226 and CD-ROM drive 230 connect to SB/ICH 204 through bus 240. HDD 226 and CD-ROM drive 230 may use, for example, an integrated drive electronics (IDE) or serial advanced technology attachment (SATA) interface. Super I/O (SIO) device 236 may be connected to SB/ICH 204.

An operating system runs on processing unit 206. The operating system coordinates and provides control of various components within the data processing system 200 in FIG. 2. As a client, the operating system may be a commercially available operating system such as Microsoft® Windows® XP (Microsoft and Windows are trademarks of Microsoft Corporation in the United States, other countries, or both). An object-oriented programming system, such as the Java™ programming system, may run in conjunction with the operating system and provides calls to the operating system from Java™ programs or applications executing on data processing system 200 (Java is a trademark of Sun Microsystems, Inc. in the United States, other countries, or both).

As a server, data processing system 200 may be, for example, an IBM® eServer™ pSeries® computer system, running the Advanced Interactive Executive (AIX®) operating system or the LINUX® operating system (eServer, pSeries and AIX are trademarks of International Business Machines Corporation in the United States, other countries, or both while LINUX is a trademark of Linus Torvalds in the United States, other countries, or both). Data processing system 200 may be a symmetric multiprocessor (SMP) system including a plurality of processors in processing unit 206. Alternatively, a single processor system may be employed.

Instructions for the operating system, the object-oriented programming system, and applications or programs are located on storage devices, such as HDD 226, and may be loaded into main memory 208 for execution by processing unit 206. The processes for illustrative embodiments of the present invention may be performed by processing unit 206 using computer usable program code, which may be located in a memory such as, for example, main memory 208, ROM 224, or in one or more peripheral devices 226 and 230, for example.

A bus system, such as bus 238 or bus 240 as shown in FIG. 2, may be comprised of one or more buses. Of course, the bus system may be implemented using any type of communication fabric or architecture that provides for a transfer of data between different components or devices attached to the fabric or architecture. A communication unit, such as modem 222 or network adapter 212 of FIG. 2, may include one or more devices used to transmit and receive data. A memory may be, for example, main memory 208, ROM 224, or a cache such as found in NB/MCH 202 in FIG. 2.

Those of ordinary skill in the art will appreciate that the hardware in FIGS. 1-2 may vary depending on the implementation. Other internal hardware or peripheral devices, such as flash memory, equivalent non-volatile memory, or optical disk drives and the like, may be used in addition to or in place of the hardware depicted in FIGS. 1-2. Also, the processes of the illustrative embodiments may be applied to a multiprocessor data processing system, other than the SMP system mentioned previously, without departing from the spirit and scope of the present invention.

Moreover, the data processing system 200 may take the form of any of a number of different data processing systems including client computing devices, server computing devices, a tablet computer, laptop computer, telephone or other communication device, a personal digital assistant (PDA), or the like. In some illustrative examples, data processing system 200 may be a portable computing device which is configured with flash memory to provide non-volatile memory for storing operating system files and/or user-generated data, for example. Essentially, data processing system 200 may be any known or later developed data processing system without architectural limitation.

With one illustrative embodiment, a client device, such as client device 110 in FIG. 1, or a server device, such as server 104 in FIG. 1, may be provided with an architectural model of the integrated circuit device, such as a hardware description language (HDL) model, register transfer level (RTL) model, or the like, for use in generating a worst case current waveform. This architectural model preferably is a primitive level model that simulates the transistors of the integrated circuit device and records the switching events of each of the transistors to obtain a switching factor per cycle of operation. Moreover, the client device 110 or server 104 may be provided with analysis tools for analyzing the architecture set forth in the model and determine a cycle-by-cycle worst case power workload. In a preferred embodiment, the analysis tools are provided by the server 104 with which the client device 110 communicates to achieve the purposes of the illustrative embodiments. The client device 110 may provide the model of the integrated circuit device to the server 104 in order for the analysis tools of the illustrative embodiments to operate on the model.

The analysis tools of the illustrative embodiments operate on the model of the integrated circuit device to identify a worst case power workload which is then simulated using the model to generate a worst case current waveform. The worst case current waveform is run on an electrical model of the integrated circuit device in order to generate one or more noise magnitude values from which a noise budget value may be determined. This noise budget value is then compared against measured noise obtained from application of the worst case power workload to an actual hardware implementation of the integrated circuit device. Based on results of the comparison, various characteristics of the simulations used to generate the worst case current waveform, noise magnitude values, and noise budget value may be adjusted to provide a better estimate of the noise obtained from the simulation with regard to the actual measured noise. Moreover, based on the results of the comparison, the worst case power workload may be modified if necessary in order to obtain results that are within specifications of the integrated circuit device. These operations may be performed automatically and in an iterative manner until a result that is within a tolerance of a desired result is achieved.

Figure 3:
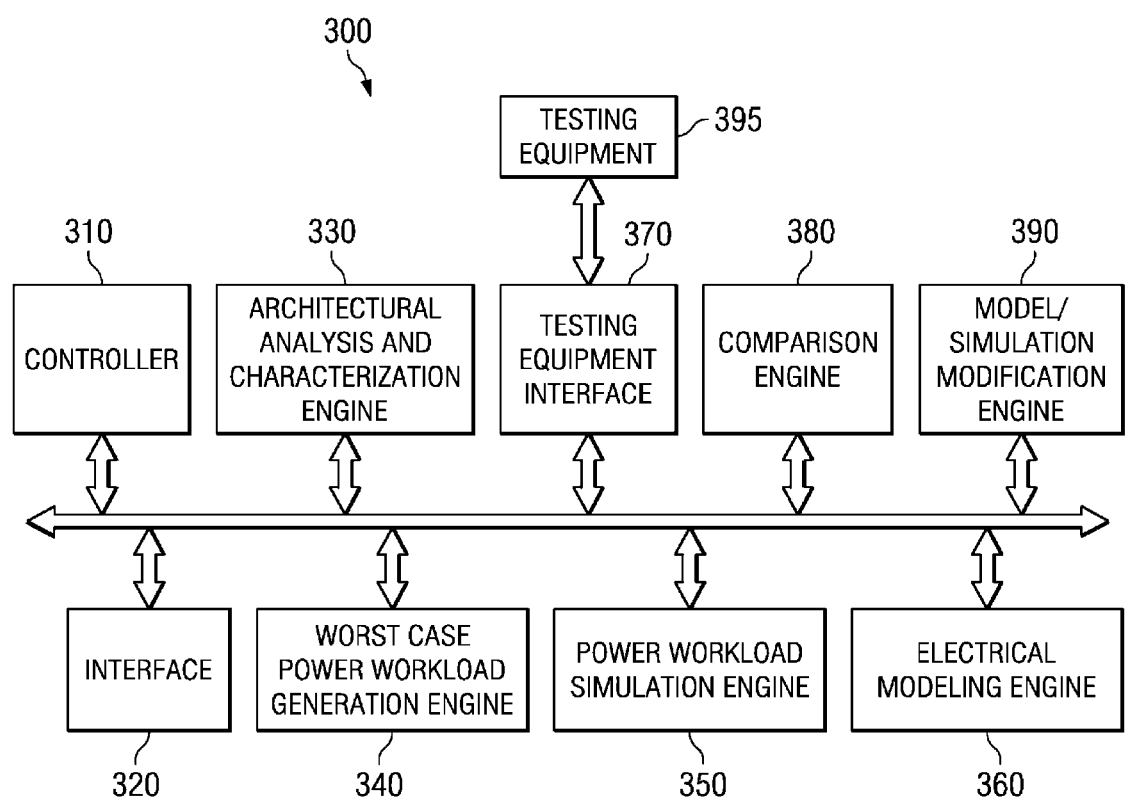
FIG. 3 is an exemplary block diagram of a worst case current waveform generation engine in accordance with one illustrative embodiment.

FIG. 3 is an exemplary block diagram of a worst case current waveform generation engine in accordance with one illustrative embodiment. It should be appreciated that the elements of the worst case current waveform depicted in FIG. 3 may be implemented in hardware, software, or any combination of hardware and software. In one illustrative embodiment, the elements in FIG. 3 are implemented as software instructions executed on one or more processors of one or more data processing devices.

As shown in FIG. 3, the worst case current waveform generation engine 300 comprises a controller 310, an interface 320, an architectural analysis and characterization engine 330, a worst case power workload generation engine 340, a power workload simulation engine 350, an electrical modeling engine 360, a testing equipment interface 370, a comparison engine 380, and a model/simulation modification engine 390. The controller 310 controls the overall operation of the worst case current waveform generation engine and orchestrates the operation of the other elements 320-390. The controller receives a primitive level model and electrical model of an integrated circuit device via the interface 320. For example, these models may be received from other modules of a server data processing system in which the worst case current waveform generation engine is present, from a client computing system separate from the data processing system on which the worst case current waveform generation engine is present, or the like.

The primitive level model preferably models the integrated circuit device at a transistor level and may be used to record the switching events associated with the transistors of the integrated circuit device at each simulation cycle. From a simulation of the primitive level model, a switching factor for each simulation cycle of the model may be generated. The switching factor identifies a ratio of the number of transistors that experiences a switching event during the simulation cycle to the total number of transistors. Such primitive level models are generally known in the art. Using an average power consumption per switching event along with the determined switching factor may provide an indication of the amount of power consumption for each cycle of the simulation.

The electrical model represents the integrated circuit device as resistive elements, capacitive elements, voltage sources, current sources, and the like. From a simulation of the electrical model, a noise waveform may be generated. Such electrical models are generally known in the art.

The architectural analysis and characterization engine 330 performs an architectural analysis and characterization of the integrated circuit device represented by the primitive level model in order to obtain a worst case power workload for use in generating a worst case current waveform. This architectural analysis and characterization results in information regarding the instruction set and pipeline used by the integrated circuit device, for example.

For example, by analyzing the issue unit state machine of the architecture, one can derive all cases that can result in 100% pipeline utilization (i.e. all pipeline stages in the execution unit being utilized at the same time). This can be derived mathematically by the architectural analysis and characterization engine 330. From there, the architectural analysis and characterization engine 330 can determine which portions of the execution unit consume the most power. This can be done, for example, by performing an exhaustive search by running all valid instructions and measuring the results. However, typically, one would remove obvious cases that will not consume much power and then do an exhaustive search on what remains.

From the knowledge of the state machine and knowledge of the high-power execution units, the architectural analysis and characterization engine 330 derives a sequence of instructions that is likely to consume the most power. Thereafter, data patterns are created that accompany the instructions that will ensure maximum switching of the execution units when the instructions are executed. Since the processor executes billions of instructions per second, it is possible to test a very large set of possibilities and narrow down the cases gradually as it becomes more obvious which instructions consume the most power.

For example, it may be found that the worst case instruction sequence is a load instruction, followed by a floating-point multiply instruction, followed by a compare instruction repeated in a loop. The data for the load should be set to an alternating pattern of 1's and 0's so that the multiply instruction requires all transistors in the multiply execution unit to switch in performing the computation.

Finally, once an optimal sequence is determined, the processor designer may study the sequence to see if any other fine-tuning adjustments can be made to consume additional power. Often times the sequence is made to "resonate" (i.e. cause a sequence of power peaks and valleys that match the fundamental noise harmonics of the processor package). The noise harmonics can be found by measuring and/or simulating the package RLC (resistance/inductance/capacitance) characteristics. The workload is then tuned to resonate at the noise harmonics while alternating between a minimum and peak power condition. As a result, a "resonant" worst-case workload is achieved by alternating between 100% and 0% utilization, i.e. power consumption, at the same frequency as the integrated circuit device and/or noise harmonics.

As discussed above, from the architecture and device characterization information, the worst case power workload generation engine 340 determines an initial worst case power workload to be applied to the integrated circuit device. The worst case power workload generation engine 340 may determine from the information obtained from the architectural analysis and characterization, for example, inputs to a pipeline of the integrated circuit device and the resulting primitive level elements that consume power in response to the inputs. For example, the analysis may determine which transistors experience a switching event and which latches change state in response to particular instruction/data inputs to the pipeline. The worst case power workload generation engine 340 may then generate a sequence of instructions and data inputs that represent a worst case power workload.

The worst case power workload may be determined as the workload that causes the most total power consumption, i.e. active power consumption due to transistor switching plus leakage power consumption. The worst case power workload is thus, a sequence of instructions that may be fed to the pipeline of the integrated circuit device that will cause the transistors in each of the stages, or at least a majority of the transistors in each of the stages, of the pipeline to be activated, i.e. will cause a switching of the transistors and thus, an active power consumption. This set of instructions may further be mirrored with determined data patterns that will cause the states of latches in the pipeline, or at least a majority of the latches in the pipeline, to be flipped. This worst case power workload may be a combination of instructions and data that do not in fact provide any useful code sequence or data pattern, i.e. it would not generally be utilized during the lifetime of the integrated circuit device, but still provides a worst case approximation of the power consumption of the integrated circuit device.

After deriving a cycle-by-cycle worst case power workload via the worst case power workload generation engine 340, the worst case current waveform generation engine 300 performs two branches of operation: a simulation branch, and an actual hardware test branch. In the simulation branch of operation, the power workload simulation engine 350 applies the derived worst case power workload from the worst case power workload generation engine 340 to the primitive level model of the integrated circuit device, which again may be a Register transfer level (RTL) model, for example, and the worst case power workload is simulated on the primitive level model.

The simulation by the power workload simulation engine 350 generates switching factor information for each cycle of the simulation. The switching factor specifies a number of transistors, relative to the total number of transistors, in the primitive level model that undergo a switching event in response to the movement of the worst case power workload instructions/data through the pipeline of the integrated circuit device. From the switching factor information, a power value for each cycle is derived by the power workload simulation engine 350. Each switching event is equated to a particular power consumption of an average transistor. Thus, by knowing the switching factor, the number of switching events may be determined and used with the average power consumption per switching event to generate an active power consumption value for the cycle. In order to obtain a total power consumption for the cycle, the active power consumption value may be added to a leakage power consumption approximation value, which may be provided as an input to the primitive level model, approximated by the primitive level model, or the like.

Based on either the active power consumption values or the total power consumption values per cycle, a worst case current versus time waveform may be generated by the power workload simulation engine 350. As is generally known in the art, current may be calculated from power for each cycle, and these current values may be combined into worst case current waveform. The power values are used to generate a current versus time waveform, i.e. the worst case current waveform, which is then output from the simulation.

The power workload simulation engine 350 may scale the worst case current waveform derived from the simulation by a scaling factor to account for input/output (I/O) related power consumption as well as various other unmodeled elements. Moreover, this scaling factor may be used to adjust the worst case current waveform to account for process variability in the manufacture of the integrated circuit device, the transistors (i.e. not all transistors consume the same amount of current when switched), and the like. The scaling factor may be determined, for example, empirically through observation of discrepancies of previous simulation results with actual hardware operation, may be input to the power workload simulation engine 350 by a user based on the user's own educated assessment, may be automatically calculated by the power workload simulation engine 350 based on differences between previous simulation results actual hardware operation measurements as determined by the comparison engine 380 discussed hereafter, or the like.

The worst case current waveform is input to an electrical modeling engine 360 of the integrated circuit device which uses an electrical model of the integrated circuit device, such as a SPICE model or other electrical model, to determine the noise magnitude associated with the worst case current waveform. The simulation of the worst case current waveform with the electrical model of the integrated circuit device provides information regarding how the voltage on the integrated circuit device varies over time at the power input to the integrated circuit device. The electrical modeling engine 360 may calculate a worst-case noise budget value based on the noise magnitude.

The budget is determined from the targeted system and package cost. To increase the budget, one adds more decoupling capacitance to the package and system board. Typically a system and package reference design is done before the processor is manufactured which established the ideal budgets to meet a cost equation for the system. Later the package and system can be fine-tuned to allow for additional noise if it is determined that the modeled noise values are inconsistent with actual hardware. This selected budget value is then used, by the comparison engine 380, to compare against actual noise measurements of the hardware under the worst case power workload to determine if the worst case current waveform provides satisfactory simulation of the actual integrated circuit device.

For example, along the second branch, i.e. the hardware test branch, testing equipment 395 runs the worst case power workload on the actual hardware of the integrated circuit device and measures the noise experienced by the hardware. The noise experienced by the hardware due to the worst case power workload may be measured, for example, using a current meter, high-speed oscilloscope, or the like. The current and voltage fluctuations over time may be observed using this test equipment 395 and the resulting measured noise values may be provided to the worst case waveform generation engine 300 via the testing equipment interface 370 for comparison, by the comparison engine 380, to the worst case noise budget value selected based on the simulated noise magnitude value obtained from the electrical model simulation.

If the measured noise is within a tolerance of the worst case noise budget, such as within 1 or 2 percent (which is approximately 10 to 20 mV) of the worst case noise budget, for example, as may be specified as a user input or passed as a parameter to the worst case waveform generation engine 300, then the noise associated with the worst case noise budget is compared with system specifications for low/mid/high/composite frequency integrated circuit device noise. The tolerance values, system specifications, and other input parameters for configuring the operation of the worst case waveform generation engine 300 may be provided as input to the worst case waveform generation engine 300 via the interface 320, for example.

If the noise associated with the worst case noise budget value is within a tolerance of the specification noise, then the worst case power workload and worst case current waveform are determined to provide an accurate representation of the actual integrated circuit device under worst case workload conditions. If the noise associated with the worst case noise budget value is not within a tolerance of the specification noise, then the process may be repeated in order to obtain a new worst case power workload and worst case current waveform. Appropriate adjustments to the primitive level model may be made in order to better approximate the actual hardware operation, e.g., more decoupling capacitors may be added to the architecture, or other modifications may be made to bring the worst case noise budget calculation into agreement with specifications for the integrated circuit device.

If the measured noise is not within the tolerance of the worst case noise budget value, then various modifications to improve the models used during simulation may be performed. For example, one can adjust the model assumptions of noise parasitics that are learned from hardware observation, e.g., one can adjust Ceff (the effective capacitance of the package), Reff (effective resistance), etc. Moreover, the transistor power consumed per switching operation and scaling factors may be adjusted to attempt to obtain a better approximation of the worst case current waveform and calculation of noise for comparison to the measured noise from the run of the worst case power workload on the hardware of the integrated circuit device. As an example, it has been observed that by separating the power consumed from switching on-to-off from off-to-on and adjusting them independently it is possible to better predict the operational characteristics of the hardware.

As mentioned above, the scaling factor is used to compensate for the fact that not all transistors consume the same amount of power when experiencing a switching event and some power consumption is associated with unmodeled elements, I/O, and the like. The approximation of this power consumption by the scaling factor may be adjusted provide a better approximation of the noise. The adjustments may be made in a subsequent iteration of the above process which may be iterated as many times as necessary to achieve a good approximation of the worst case current waveform for testing purposes.

The above worst case current waveform generation process may be repeated for each of a plurality of operational frequency ranges for the integrated circuit devices, e.g., low frequency, middle frequency, high frequency, composite frequency, etc. Thus, an appropriate worst case current waveform for testing integrated circuit devices may be obtained for each of the various operational frequencies of the integrated circuit device. The mechanisms of the illustrative embodiments provide an automated mechanism for determining the worst case current waveform which provides a more accurate determination of the worst case current waveform by providing a comparison of the noise values obtained from simulation of the integrated circuit device with noise values measured from a worst case power workload operation of a hardware implementation of the integrated circuit device. The mechanisms of the illustrative embodiment reduce the sources of human error by providing an automated mechanism for adjusting worst case workload and worst case current waveform generation.

As discussed above, the mechanisms of the illustrative embodiments make use of primitive level models and electrical models of integrated circuit devices. Such models are generally known in the art and thus, a more detailed description of these models is not provided herein. These models may receive various input parameters to control the simulation of the models for generating appropriate outputs. These inputs represent conditions of the integrated circuit device that affect the power consumption of the integrated circuit device that need to be modeled by the primitive level model.

Figure 4A:
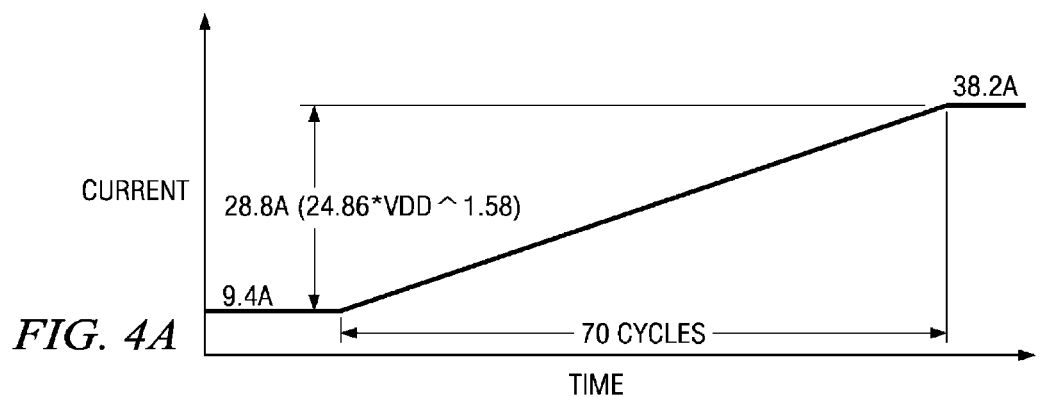
FIG. 4A is an exemplary worst case current waveform obtained by way of the mechanisms of the illustrative embodiments for an exemplary low frequency operation of an integrated circuit device.
Figure 4B:
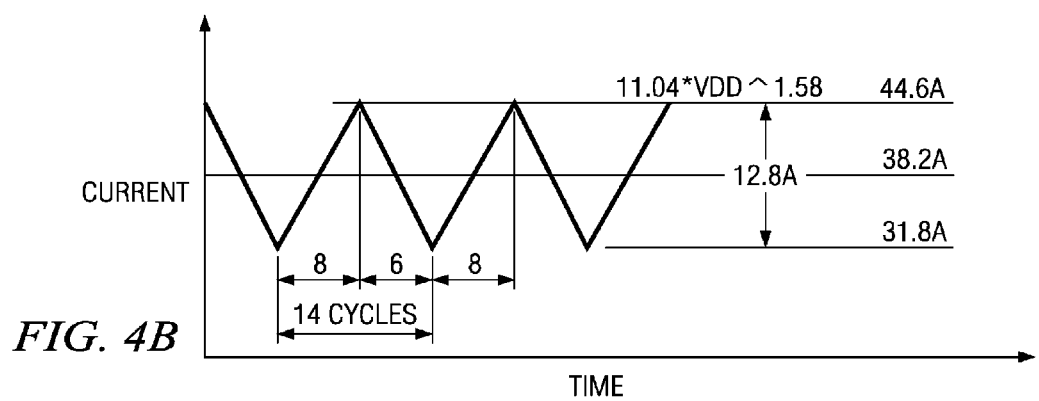
FIG. 4B is an exemplary worst case current waveform obtained by way of the mechanisms of the illustrative embodiments for an exemplary middle frequency operation of the integrated circuit device.
Figure 4C:
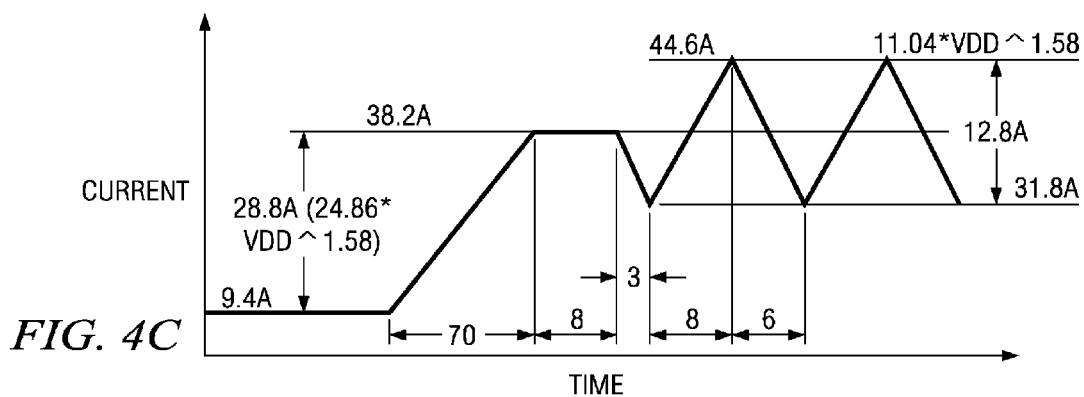
FIG. 4C is an exemplary worst case current waveform obtained by way of the mechanisms of the illustrative embodiments for a composite frequency operation of the integrated circuit device.

Based on the primitive level model simulation of the worst case power workload, a transistor level switching factor for each cycle of the simulation is generated and converted into a power consumption value for the integrated circuit device. The power consumption values may then be converted to current values for the various cycles which may be plotted against time (or cycles) to thereby generate a worst case current waveform. FIGS. 4A-4C are exemplary worst case current waveforms that may be generated for various grades of integrated circuit devices that may be generated using the mechanisms of the illustrative embodiments.

FIG. 4A is an exemplary worst case current waveform obtained by way of the mechanisms of the illustrative embodiments for an exemplary low frequency operation of an integrated circuit device. As shown in FIG. 4A, the worst case current waveform starts from an idle state (e.g., 9.4 A) and transitions to a peak current consumption of 38.2 A 70 cycles later (each cycle in this case corresponds to approximately 312.5 ps). The 70 cycles corresponds to the depth of the pipeline of the integrated circuit device. This low frequency worst-case current waveform targets low frequency noise (e.g., approximately less than 10 MHz) which the integrated circuit device must handle. This may correspond, for example, to a start up operation of the integrated circuit device where the integrated circuit device eventually achieves an initial stable current consumption.

FIG. 4B is an exemplary worst case current waveform obtained by way of the mechanisms of the illustrative embodiments for an exemplary middle frequency operation of the integrated circuit device. As shown in FIG. 4B, the current consumption fluctuates around the stable 38.2 A between 31.8 A and 44.6 A over a 14 cycle period. The middle frequency worst-case current waveform targets mid-frequency noise (e.g., up to approximately 200 MHz) which the integrated circuit device must handle. This middle frequency operation may correspond to normal operation of the integrated circuit device, for example.

FIG. 4C is an exemplary worst case current waveform obtained by way of the mechanisms of the illustrative embodiments for a composite frequency operation of the integrated circuit device. The worst case current waveform of FIG. 4C is essentially a combination of the waveforms from FIGS. 4A and 4B. A first portion of the waveform corresponds to the low frequency operation of FIG. 4A where the integrated circuit device is first be powered on. A second portion of the waveform corresponds to the middle frequency operation of FIG. 4B where normal workload operations of the integrated circuit device are expected to occur and thus, the current consumption fluctuations are encountered. This composite worst case current waveform may be generated from multiple iterations of the worst case waveform generation operation described above, for low frequency operation and middle frequency operation, and may be used for testing of integrated circuit devices, such as to generate a voltage guard band for the integrated circuit devices. Moreover, if only low or middle frequency operation is of concern, these worst case current waveforms may be used in addition to, or in replacement of, the composite worst case current waveform for testing of the integrated circuit device.

Figure 5:
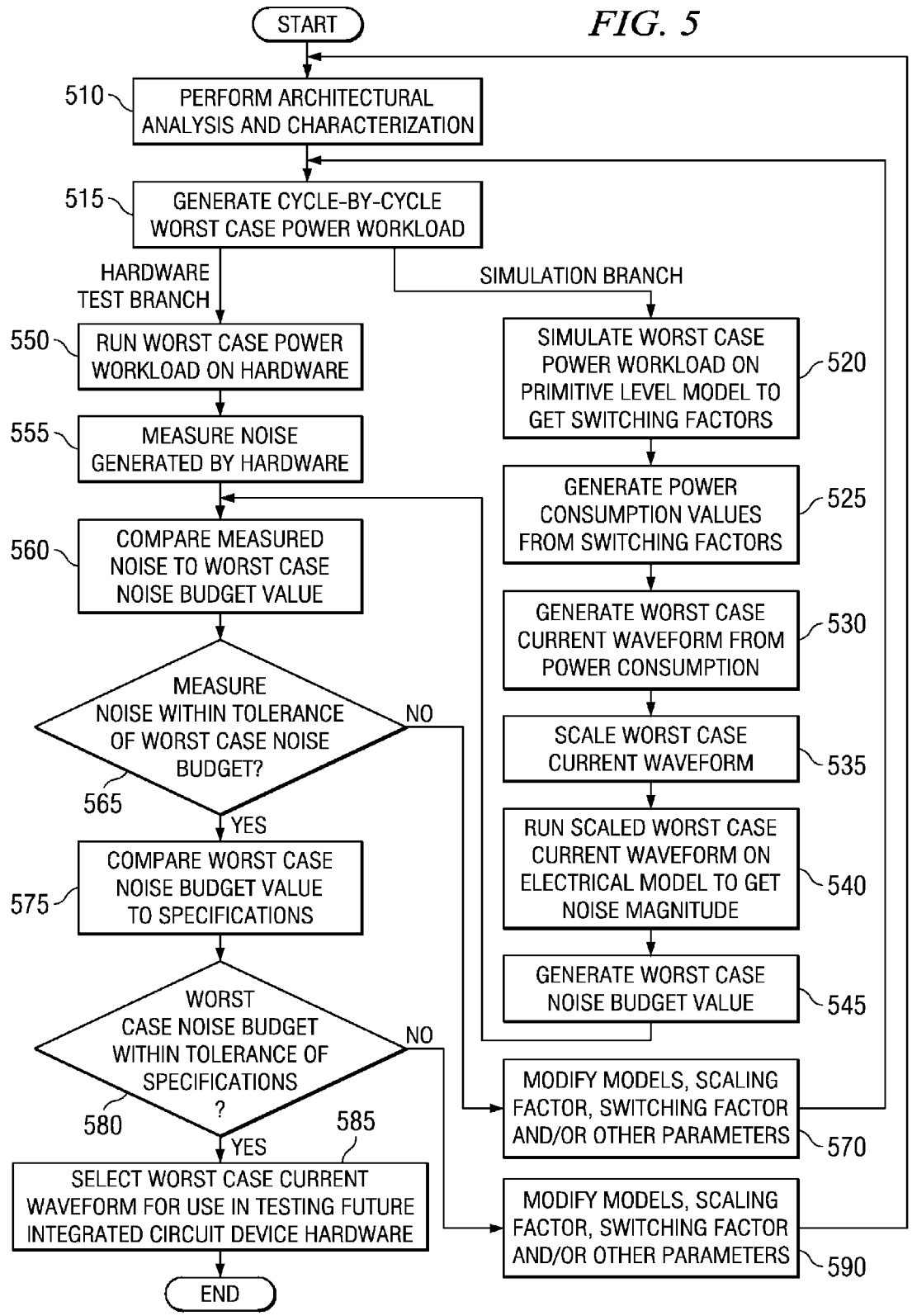
FIG. 5 is a flowchart outlining an exemplary operation for generating a worst case current waveform in accordance with one illustrative embodiment.

FIG. 5 is a flowchart outlining an exemplary operation for generating a worst case current waveform in accordance with one illustrative embodiment. It will be understood that each block of the flowchart illustration in FIG. 5 and the flowchart illustrations set forth hereafter in other figures, and combinations of blocks in the flowchart illustrations, can be implemented by computer program instructions. These computer program instructions may be provided to a processor or other programmable data processing apparatus to produce a machine, such that the instructions which execute on the processor or other programmable data processing apparatus create means for implementing the functions specified in the flowchart block or blocks. These computer program instructions may also be stored in a computer-readable memory or storage medium that can direct a processor or other programmable data processing apparatus to function in a particular manner, such that the instructions stored in the computer-readable memory or storage medium produce an article of manufacture including instruction means which implement the functions specified in the flowchart block or blocks.

Accordingly, blocks of the flowchart illustrations support combinations of means for performing the specified functions, combinations of steps for performing the specified functions and program instruction means for performing the specified functions. It will also be understood that each block of the flowchart illustrations, and combinations of blocks in the flowchart illustrations, can be implemented by special purpose hardware-based computer systems which perform the specified functions or steps, or by combinations of special purpose hardware and computer instructions.

Furthermore, the flowcharts are provided to demonstrate the operations performed within the illustrative embodiments. The flowcharts are not meant to state or imply limitations with regard to the specific operations or, more particularly, the order of the operations. The operations of the flowcharts may be modified to suit a particular implementation without departing from the spirit and scope of the present invention.

As shown in FIG. 5, the operation starts with the worst case waveform generation engine performing architectural analysis and characterization of the integrated circuit device design (step 510). The worst case waveform generation engine generates a cycle-by-cycle worst case power workload based on the results of the architectural analysis and characterization (step 515). Thereafter, two branches, i.e. a simulation branch and a hardware test branch, are executed virtually in parallel.

The simulation path involves the worst case waveform generation engine simulating the worst case power workload on a primitive level model, e.g., an HDL or RTL model, of the integrated circuit device to obtain a transistor level switching factor for each cycle of the simulation (step 520). The worst case waveform generation engine generates power consumption values from the transistor level switching factor values (step 525). The worst case waveform generation engine generates a worst case current waveform from the power consumption values per cycle of simulation (step 530).

The worst case waveform generation engine scales the worst case current waveform to account for I/O, various unmodeled elements, process variability, and the like (step 535). The worst case waveform generation engine runs the resulting scaled worst case current waveform on an electrical model of the integrated circuit device to find a noise magnitude for the simulation (step 540). The worst case waveform generation engine generates a worst case noise budget value based on the noise magnitude (step 545).

The hardware test branch involves the worst case waveform generation engine using test equipment to apply the worst case power workload to a hardware implementation of the integrated circuit device which runs the worst case workload (step 550). The noise generated on the integrated circuit device hardware is measured by the test equipment and provided to the worst case waveform generation engine (step 555).

The worst case waveform generation engine compares the noise measured from the hardware with the worst case noise budget value generated based on the simulation (step 560). The worst case waveform generation engine determines whether the two noise values are within a threshold of each other (step 565). If not, the integrated circuit models, scaling factor, switching factor, and/or other parameters of the simulations are modified based on the discrepancy of the noise values (step 570) and the operation returns to step 515.

If the two noise values are within a tolerance of each other, the worst case waveform generation engine compares the noise of the worst case noise budget value to system specifications for low/mid/high and composite frequency noise (step 575). The worst case waveform generation engine determines if the noise of the worst case noise budget value is within system specifications (step 580). If so, then the worst case current waveform generated by the simulation of the electrical model is selected as the worst case current waveform for testing of integrated circuit devices (step 585). If not, then the worst case waveform generation engine performs modifications to the models, scaling factor, etc., so as to improve the noise performance of the simulation (step 590) and the operation returns to step 510.

The worst case current waveform developed using the mechanisms described above may be used, in one illustrative embodiment, to calculate the guard band for an integrated circuit device based on a comparison of simulated noise obtained from a simulation of the integrated circuit device using the worst case current waveform stimuli with simulated or measured power supply noise of a workload/test pattern that may be achieved using testing equipment. With such an illustrative embodiment, a client computing device may provide an integrated circuit model to a server computing device in which simulation and analysis engines are provided. As part of the simulation of the integrated circuit model, the mechanisms of the illustrative embodiments may simulate the integrated circuit model using a worst case current waveform to thereby generate a worst case noise estimate. In addition, the simulation engine may further simulate the operation of the integrated circuit model using a workload/test pattern that is achievable by testing equipment that may be used to verify the operation of a hardware implementation of the integrated circuit model. For example, this workload/ test pattern may be a logical built-in self test (LBIST) test pattern, array built-in self test (ABIST), or any other test pattern that is of a critical nature for testing the operation of the integrated circuit device. In one illustrative embodiment, the workload/test pattern that is applied as part of the simulation is an impulse response workload using a LBIST test pattern.

The noise results of the simulations performed by the application of the worst case current waveform and the achievable workload/test pattern are measured as part of the simulation. These noise results are then used by the simulation engine to calculate a guard band for the minimum operating voltage obtained from simulation of the integrated circuit model using the achievable workload/test pattern. The calculation of the guard band further comprises the calculation of a scaling factor based on a comparison of measured noise for an achievable workload/test pattern and simulated noised for the same achievable workload/test pattern. From this, the actual minimum supply voltage in which the least power dissipation may be identified as the minimum operating voltage plus the guard band.

Figure 6:
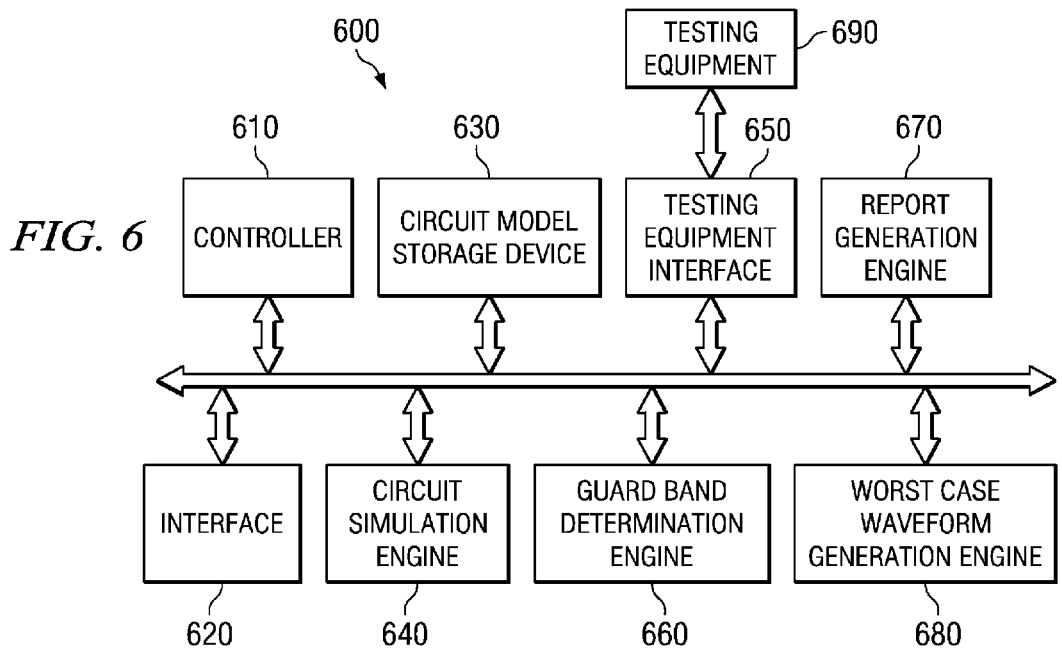
FIG. 6 is an exemplary block diagram of a circuit simulation engine in accordance with one illustrative embodiment.

FIG. 6 is an exemplary block diagram of a simulation engine in accordance with one illustrative embodiment. The elements shown in FIG. 6 may be implemented in hardware, software, or any combination of hardware and software. In one illustrative embodiment, the elements in FIG. 6 are implemented as software instructions executed by one or more data processing devices. The elements of FIG. 6 may be implemented entirely within one computing device or may be distributed across a plurality of computing devices.

As shown in FIG. 6, the circuit simulation system 600 includes a controller 610, an interface 620, a circuit model storage device 630, a circuit simulation engine 640, a testing equipment interface 650, a guard band determination engine 660, a report generation engine 670, and a worst case waveform generation engine 680. It should be appreciated that the worst case waveform generation engine 680 shown in FIG. 6 may be the worst case current waveform generation engine 300 in FIG. 3 described previously, or a modification of the worst case current waveform generation engine 300. The worst case waveform generation engine 680 preferably implements a worst case waveform generation process as described previously above in order to obtain a worst case current waveform that may be used in conjunction with the other elements 610-670 of FIG. 6 to achieve the purposes of generating a guard band for an integrated circuit device.

The controller 610 controls the overall operation of the circuit simulation system 600 and orchestrates the operation of the other elements 620-680. The interface 620 provides a communication interface through which integrated circuit model information may be received from other applications and/or other computing devices. The interface 620 may be a network interface through which integrated circuit model information may be received from one or more client devices and results of simulation may be provided to the one or more client devices. The interface 620 may also be an interface through which user input is received to configure simulations performed by the circuit simulation system 600.

Furthermore, in some illustrative embodiments, the interface 620, along with testing equipment interface 650, may provide a user with an interface to testing equipment 690 for applying test workloads/patterns to a hardware implementation of the integrated circuit model to thereby obtain noise measurements. For example, the testing equipment, which is generally known in the art, may apply such workloads and/or test patterns to an integrated circuit chip containing the integrated circuit corresponding to the integrated circuit model and measure the supply voltage noise generated as a result of running the integrated circuit chip using the applied workloads/test patterns. The measured supply voltage noise may be input to the circuit simulation system 600 for use by the guard band determination engine 660 in determining a guard band for a minimum supply voltage, as described hereafter.

The circuit model storage device 630 stores the integrated circuit model information obtained through the interface 620 for use in performing simulation. This circuit model information may include, for example, one or more netlist data structures specifying the nets of the integrated circuit model as well as other information that typically makes up an integrated circuit model as is generally known in the art. In addition, results data of actual testing of a hardware implementation of the integrated circuit model may be stored in the circuit model storage device 630 for later use by the circuit simulation system 600.

The circuit simulation engine 640 performs simulation of the integrated circuit model for purposes of verifying the operation of the integrated circuit model as well as predicting the minimum operational (or functional) voltage VminF at which the integrated circuit model may operate. The circuit simulation engine 640 may simulate the integrated circuit model using one or more workloads and/or test patterns that are achievable by testing equipment for verifying the operation of the integrated circuit. For example, an impulse response workload applying a logical built-in self test (LBIST) pattern to the integrated circuit model may be used to simulate the operation of the integrated circuit. The simulation results in various output results data including a noise measurement of the supply voltage.

In addition to simulating the achievable workload and/or test pattern using the integrated circuit model, results data from an actual test of a hardware implementation of the integrated circuit device may be obtained via the testing equipment interface 650. As is generally known in the art, such testing may be performed using testing equipment 690 that applies the workload and/or test pattern to the hardware comprising the integrated circuit corresponding to the integrated circuit model, e.g., an integrated circuit chip. The testing equipment 690 measures the output of the hardware as well as operational characteristics of the hardware including supply voltage noise, power dissipation, temperature, and the like. The measured operational characteristics may be provided to the circuit simulation engine 640 from the testing equipment 690 via the testing equipment interface 650 and may be stored in the circuit model storage device 630, as mentioned above.

Moreover, the circuit simulation engine 640 may simulate the operation of the integrated circuit by applying a worst case current waveform to the integrated circuit model to thereby simulate the integrated circuit model under a worst case situation. This worst case current waveform is typically not achievable by testing equipment and thus, the worst case situation must be simulated using the circuit simulation engine 640 and the integrated circuit model. The worst case current waveform is defined by the human designer based on, for example, the designer's understanding of the microarchitecture, instruction sets, circuit behavior, and chip-package-system interaction.

The simulations performed by the circuit simulation engine 640 with regard to the achievable workload/test pattern and the worst case current waveform may include performing power dissipation simulations, as is generally known in the art. These power dissipation simulations result in an estimate of the noise in the supply voltage for the integrated circuit device comprising the integrated circuit model.

Because such simulations are generally known in the art, a detailed description is not provided herein.

The noise measurement data from the simulations and actual testing of the achievable workload/test pattern and the worst case current waveform are provided to the guard band determination engine 660. Based on measurement noise data obtained from actual testing of the hardware for an achievable workload/test pattern and simulated noise data obtained from a simulation of the integrated circuit model for the same achievable workload/test pattern, the guard band determination engine 660 determines a scaling factor for the guard band calculation. The guard band determination engine 660 further calculates the guard band based on this scaling factor and a difference between a noise of the supply voltage for the simulation of the achievable workload/test pattern and a noise of the supply voltage for a simulation of the worst case current waveform.

For example, a workload/test pattern that is achievable by the testing equipment 690 may be selected by the circuit simulation engine 640. This workload/test pattern may be a pulse response workload of an LBIST, ABIST, or other critical test pattern. A pulse response workload is selected for the illustrative embodiments because it simplifies the correlation of measured and simulated noise data. Other workloads and/or test patterns may be used without departing from the spirit and scope of the present invention. For example, the simulation and testing of the integrated circuit device may be performed over a plurality of cycles, but would require that noise measurements and noise values obtained from simulation be correlated by a correlation mechanism.

The scaling factor k may be determined as the ratio of the measured noise value for an actual test of the integrated circuit chip using the testing equipment 690 to the noise value obtained from simulation of the same workload/test pattern using simulation of the integrated circuit model. This provides a relationship between noise values estimated by the simulation to noise values actually seen in the physical hardware. Thus, the scaling factor k is determined in accordance with the following relationship: k=measured_noise/simulated_noise.

The noise value obtained from the simulation of the integrated circuit model may further be used in the equation utilized by the guard band determination engine 660 to calculate the guard band. In particular, the guard band is calculated as the difference between the simulated noise obtained from the simulation of the integrated circuit model using the achievable workload and/or test pattern, and the simulated noise value obtained from a simulation of the integrated circuit model using a worst case current waveform. This difference is multiplied by the scaling factor determined in the manner described above. Thus, the guard band, or VminF voltage offset (VVO), may be calculated according to the following equation: VVO=k*(Noise$_{Vsim\_testpattern}$−Noise$_{Vsim\_worstcase}$).

The resulting guard band defined by VVO may be reported to the user of the circuit simulation system 600 via the report generation engine 670. It is this guard band VVO that is to be added to the minimum supply voltage VminF, determined from application of the specific workload/test pattern to the integrated circuit device, in order to obtain the real minimum supply voltage condition.

The above process for determining the guard band for VminF may be performed with regard to a plurality of different workloads and/or test patterns. Typically, such a process may be performed with regard to the most critical workloads and/or test patterns for the integrated circuit device. Each process may generate a different guard band for the different workloads and/or test patterns. Thereby, the minimum operating voltage for the integrated circuit device that achieves the least power dissipation may be determined and used with the integrated circuit device.

Figure 7A:
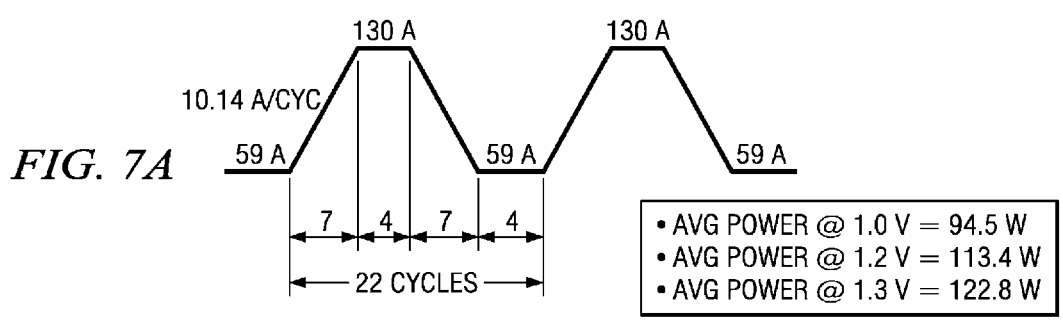
FIG. 7A is an exemplary worst case current waveform in accordance with one exemplary embodiment.

As an example implementation of the methodology utilized by the guard band determination engine 660, assume that the workload/test that is chosen to obtain simulation and test measurement results is a pseudo-impulse response (a scan shift in LBIST test). It is further assumed that the workload/test that is used to determine the minimum operational voltage VminF is a LBIST test pattern and that the worst case current waveform has been determined by a designer of the integrated circuit model to be as shown in FIG. 7A. The designer determines the worst case current waveform based on the designer's understanding of the microarchitecture, instruction sets, circuit behavior, and chip-package-system interaction, for example. As shown in FIG. 7A, this worst case current waveform has a voltage of 1.2V and frequency of 3.2 GHz. The waveform has a range of 59 amps to 130 amps, as shown.

Figure 7B:
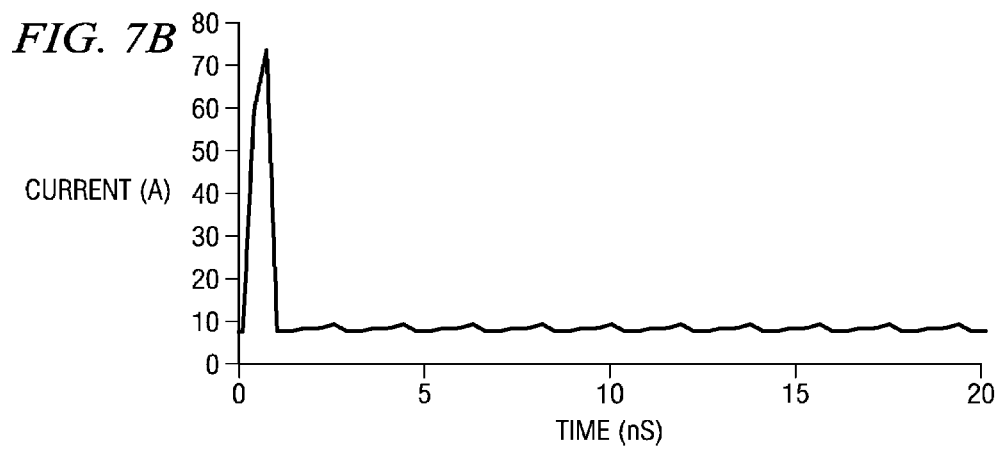
FIG. 7B is an exemplary impulse current waveform in accordance with one exemplary embodiment.
Figure 7C:
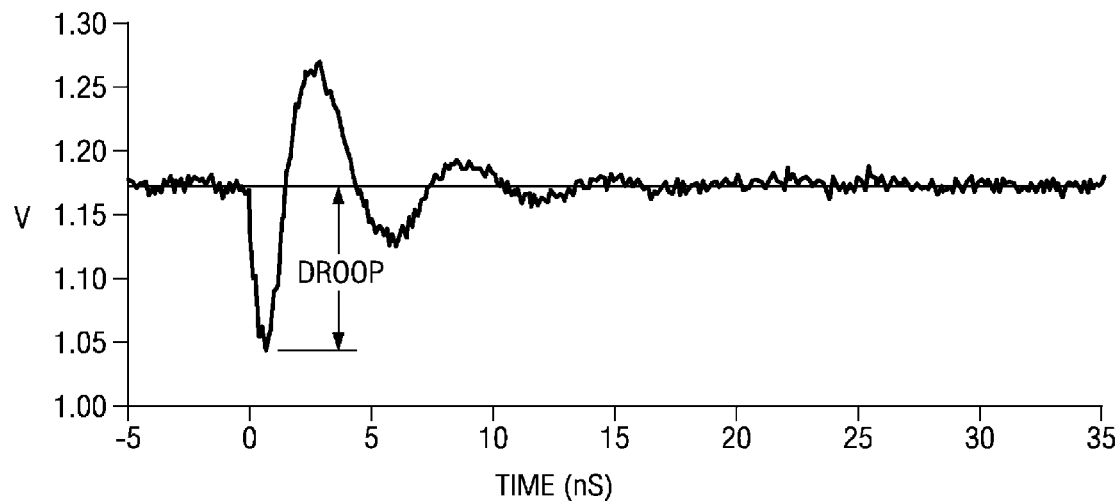
FIG. 7C is an exemplary measured impulse response waveform in accordance with one exemplary embodiment.

The integrated circuit device is tested using the LBIST test pattern and an impulse current as shown in FIG. 7B. The testing is performed at an operating frequency of 3.2 GHz and over various operating voltages including 1.0 V, 1.1 V, and 1.2 V. An example of the measured impulse response waveform for an operating voltage of 1.2 V is shown in FIG. 7C. The measured noise, or droop, in the supply voltage is determined for a plurality of parts, i.e. a particular number of integrated circuit chips that are tested, and is averaged, as illustrated in Table 1 below. The number of parts used in Table 1 is only exemplary and is not intended to be limiting on the present invention. The number of parts that are used may be determined based on statistical needs and may be greater than or less than the number of parts shown in Table 1 without departing from the spirit and scope of the present invention.

TABLE 1

Average Measured Droop of Impulse Response

| Part # | Droop_1.2 V | Droop_1.1 V | Droop_1.0 V |
|---|---|---|---|
| 1 | 137.0 | 122.8 | 107.4 |
| 2 | 137.0 | 124.0 | 103.0 |
| 3 | 133.0 | 117.0 | 106.0 |
| 4 | 128.0 | 116.0 | 100.0 |
| 5 | 134.0 | 111.0 | 105.0 |
| 6 | 130.0 | 118.0 | 104.0 |
| 7 | 135.0 | 113.0 | 106.0 |
| 8 | 130.0 | 118.0 | 107.0 |
| 9 | 130.0 | 113.0 | 103.0 |
| 10 | 133.0 | 117.0 | 105.0 |
| Average | 132.7 | 117.0 | 104.6 |

Figure 7D:
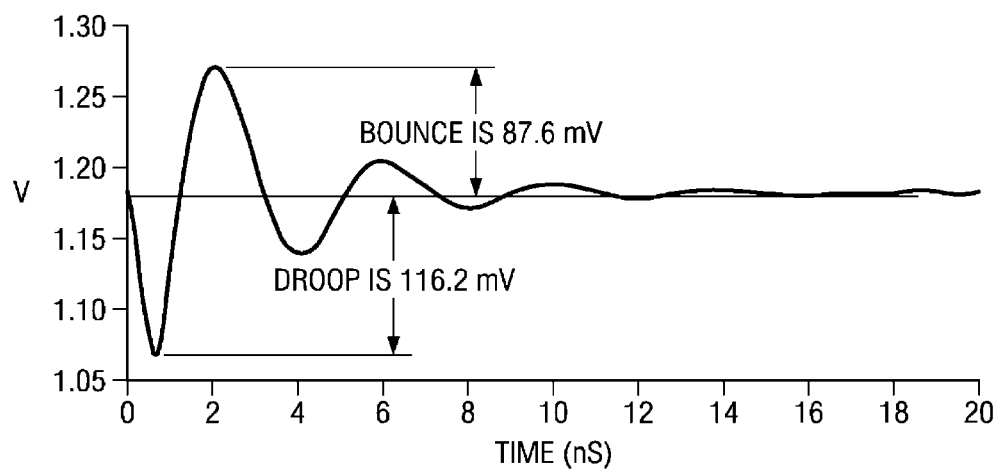
FIG. 7D is an exemplary simulated impulse response waveform in accordance with one exemplary embodiment.

The average droop over the 10 parts in Table 1 is used to calculate the scaling factor along with the droop in the simulated impulse response for the same workload/test pattern. For example, assume that, through simulation of the integrated circuit device, using the same impulse response LBIST test pattern used to measure the droop in FIG. 7C, the simulated impulse response obtained is as shown in FIG. 7D. As shown in FIG. 7D, the droop, or noise, for the simulated impulse response is approximately 116.2 mV. Thus, the worst droop in the simulation is 116.2 mV and the average worst droop measured is 132.7 mV for an operating voltage of 1.2V. As a result, the scaling factor k is 132.7/116.2 or 1.142. Thus, if a test pattern has a simulated droop of Vnoise, its expected measured result of the actual hardware implementation should be k*Vnoise or 1.142*Vnoise.

Figure 7E:
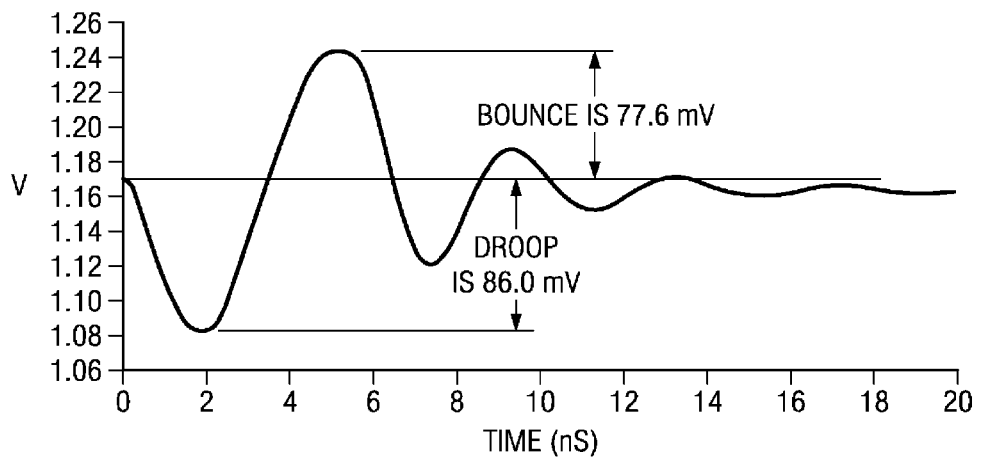
FIG. 7E is an exemplary simulated noise waveform for a simulation in which the worst case current waveform of FIG. 7A is applied in accordance with one illustrative embodiment.

Now assume that through application of the worst case current waveform of FIG. 7A to the integrated circuit model, an impulse response is obtained from the simulation as shown in FIG. 7E. As shown in FIG. 7E, the worst droop is approximately 86.0 mV.

Figure 7F:
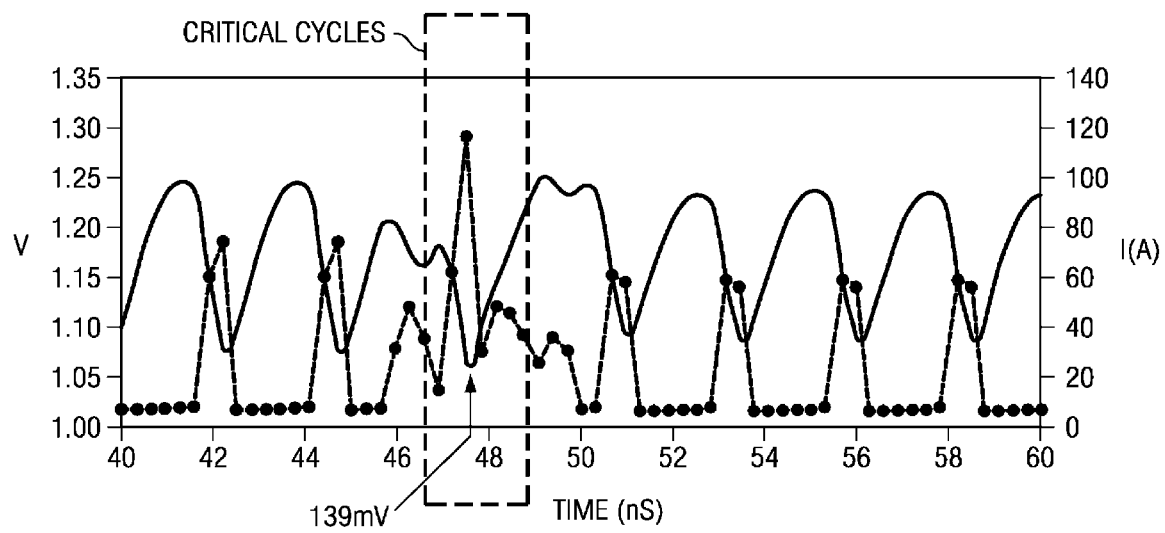
FIG. 7F illustrates a voltage waveform obtained from simulation of a LBIST pattern to the integrated circuit model in order to obtain a VminF value.

FIG. 7F illustrates a voltage waveform obtained from simulation of a LBIST pattern to the integrated circuit model in order to obtain a VminF value. As shown in FIG. 7F, the waveform has a worst droop of approximately 139 mV, measured from the nominal voltage of 1.2V.

From these various waveforms, the equation for the guard band, VVO, may be evaluated. For the example shown in FIGS. 7A-7F, the value for VVO may be obtained as follows:

$$VVO = k*((\text{Noise}_{Vsim\_testpattern} - \text{Noise}_{Vsim\_worstcase})$$

$$VVO = 1.142*(139.0 \text{ mV} - 86.0 \text{ mV}) = 60.5 \text{ mV}$$

Thus, a guard band of 60.5 mV should be subtracted from the VminF value obtained from the simulation of the LBIST pattern to the integrated circuit model. If the VVO value were to be negative, i.e. the simulation of the worst case current waveform results in greater noise than the simulation of the test pattern, then the guard band value is added to the VminF value. Therefore, through the mechanisms of the illustrative embodiments, a new VminF value may be calculated based on a calculated guard band for a workload/test pattern applied to the integrated circuit model/device.

It should be appreciated that the exemplary operation described above with regard to FIGS. 7A-7F is only exemplary. Modifications to the above operation may be performed without departing from the spirit and scope of the illustrative embodiments. Such modifications may take many different forms and thus, all of these modifications cannot be described herein. So long as the guard band is determined based on a relationship between simulated noise for a workload/test pattern and simulated noise for a worst case current waveform, any other modifications to the above operation are intended to be within the spirit and scope of the illustrative embodiments. For example, in some illustrative embodiments, a different relationship may be utilized for determining the scaling factor for the guard band calculation. Moreover, a different relationship between the simulated noise for a workload/test pattern and simulated noise for a worst case current waveform than that illustrated above may be utilized in other illustrative embodiments.

Figure 8:
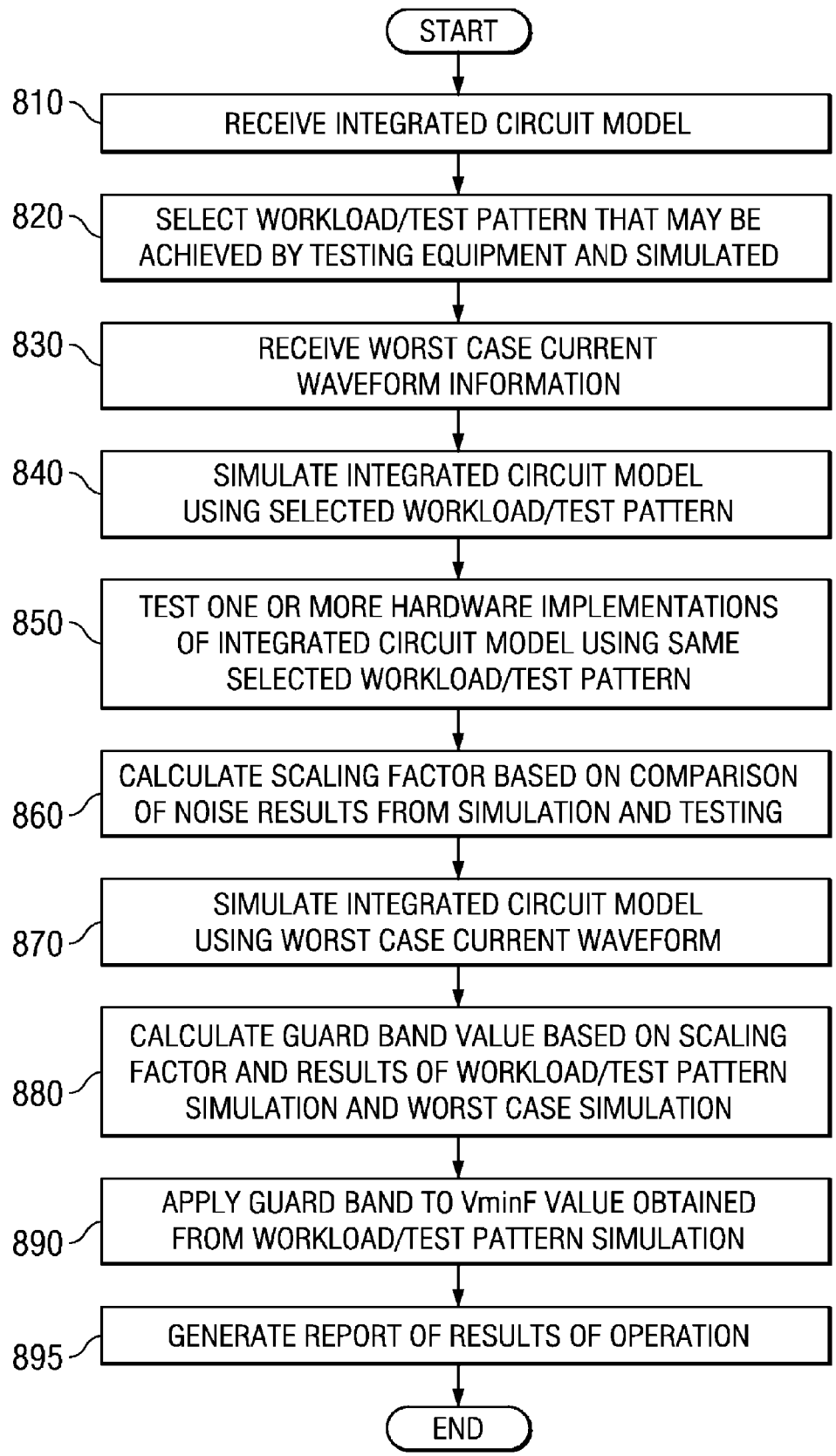
FIG. 8 is a flowchart outlining an exemplary operation of an illustrative embodiment for calculating and applying a guard band to a minimum operational voltage determined through simulation of an integrated circuit device.

FIG. 8 is a flowchart outlining an exemplary operation of an illustrative embodiment for calculating and applying a guard band to a minimum operational voltage determined through simulation of an integrated circuit device. As shown in FIG. 8, the operation starts with the simulation engine receiving an integrated circuit model to be simulated (step 810). The simulation engine selects a workload/test pattern that may be achieved by the testing equipment and simulated by the simulation engine (step 820). The simulation engine further receives a worst case current waveform (step 830). The simulation engine simulates the integrated circuit model using the selected workload/test pattern (step 840) and tests one or more hardware implementations of the integrated circuit model using the same selected workload/test pattern (step 850). The simulation engine calculates a scaling factor based on a comparison of the noise results of the simulation with the noise results of the hardware testing (step 860).

The simulation engine simulates the integrated circuit model using the worst case current waveform (step 870). The simulation engine uses the noise result of the worst case current waveform simulation along with the noise result of the workload/test pattern simulation and the scaling factor to generate a guard band value or VminF voltage offset (step 880). The guard band or VminF voltage offset may then be applied to a VminF value obtained from the simulation of the workload/test pattern to obtain a smallest operating voltage that generates a least amount of power dissipation (step 890). The results of the above analysis and calculations may be reported to a user (step 895) and the operation terminates.

Thus, the illustrative embodiments provide a mechanism for determining a guard band for an operational voltage of an integrated circuit device. The mechanisms of the illustrative embodiment determine the guard band based on a relationship of noise values obtained through a simulation of the integrated circuit device to actual measured noise values of hardware implementations of the integrated circuit device. The guard band is further determined based on noise results of a simulation of the integrated circuit device under an achievable workload/test pattern and under a worst case current waveform. As a result, a more accurate determination of a guard band for the minimum operating voltage of the integrated circuit device is obtained when compared to traditional methods for determining the guard band.

It should be appreciated that the illustrative embodiments may take the form of an entirely hardware embodiment, an entirely software embodiment or an embodiment containing both hardware and software elements. In one exemplary embodiment, the mechanisms of the illustrative embodiments are implemented in software, which includes but is not limited to firmware, resident software, microcode, etc.

Furthermore, the illustrative embodiments may take the form of a computer program product accessible from a computer-usable or computer-readable medium providing program code for use by or in connection with a computer or any instruction execution system. For the purposes of this description, a computer-usable or computer-readable medium can be any apparatus that can contain, store, communicate, propagate, or transport the program for use by or in connection with the instruction execution system, apparatus, or device.

The medium may be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read-only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method, in a data processing system, for determining a worst case current waveform for testing an integrated circuit device, comprising:
   generating a worst case power workload for the integrated circuit device;
   simulating the worst case power workload on a primitive level model of the integrated circuit device to generate a worst case current waveform;
   simulating the worst case current waveform on an electrical model of the integrated circuit device to generate a worst case noise value;
   measuring actual noise of the integrated circuit device running the worst case power workload;
   comparing the actual noise to the worst case noise value; and
   selecting, based on results of the comparison, the worst case current waveform for use in testing integrated circuit devices if the actual noise is within a tolerance of the worst case noise value.

2. The method of claim 1, wherein generating a worst case power workload for the integrated circuit device, comprises:
   performing an architectural analysis of the primitive level model that simulates transistors of the integrated circuit device; and
   deriving, as the worst case power workload, a sequence of instructions that cause the integrated circuit device to consume a maximum amount of power when executed by the integrated circuit device, based on the architectural analysis.

3. The method of claim 2, wherein performing an architectural analysis of the primitive level model further comprises:
   analyzing an issue unit state machine of the integrated circuit device to derive at least one situation in which all pipeline stages of a pipeline of an execution unit in the integrated circuit device are utilized at a same time; and
   determining which portions of the execution unit consume the most power under the at least one situation by running valid instructions through the pipeline and analyzing results of running the valid instructions, wherein the sequence of instructions is derived based on the results of running the valid instructions.

4. The method of claim 2, wherein generating a worst case power workload for the integrated circuit device further comprises:
   creating one or more data patterns to accompany the sequence of instructions, the one or more data patterns providing maximum switching of the transistors of an execution unit when the sequence of instructions is executed by the integrated circuit device.

5. The method of claim 2, wherein generating a worst case power workload for the integrated circuit device further comprises:
   adjusting the sequence of instructions to generate a sequence of instructions having a corresponding sequence of power consumption peaks and valleys that match fundamental noise harmonics of the integrated circuit device.

6. The method of claim 1, wherein simulating the worst case power workload on a primitive level model of the integrated circuit device to generate a worst case current waveform comprises:
   generating switching factor information for each cycle of the simulation; and
   generating a power consumption value for each cycle of the simulation based on the switching factor information and an average transistor power consumption per switching event value; and
   generating the worst case current waveform based on the power consumption value for each cycle of the simulation.

7. The method of claim 6, further comprising:
   scaling the worst case current waveform using a scaling factor to account for at least one of input/output related power consumption or process variability in formation of transistors.

8. The method of claim 1, wherein the worst case noise value is a worst case noise budget value derived from a noise magnitude value generated by simulating the worst case current waveform on the electrical model of the integrated circuit device.

9. The method of claim 1, further comprising:
   modifying at least one of an architecture of the primitive level model, assumptions of noise parasitics in the electrical model, a transistor power consumed per switching operation value used to generate the worst case current waveform, or a scaling factor used to generate the worst case current waveform; and
   repeating the steps of claim 1 following the modification.

10. The method of claim 1, further comprising:
    repeating the steps of claim 1 for each of a plurality of operational frequency ranges of the integrated circuit device.

11. A computer program product comprising a computer useable storage medium having a computer readable program, wherein the computer readable program, when executed on a computing device, causes the computing device to:
    generate a worst case power workload for an integrated circuit device;
    simulate the worst case power workload on a primitive level model of the integrated circuit device to generate a worst case current waveform;
    simulate the worst case current waveform on an electrical model of the integrated circuit device to generate a worst case noise value;
    measure actual noise of the integrated circuit device running the worst case power workload;
    compare the actual noise to the worst case noise value; and
    select, based on results of the comparison, the worst case current waveform for use in testing integrated circuit devices if the actual noise is within a tolerance of the worst case noise value.

12. The computer program product of claim 11, wherein the computer readable program causes the computing device to generate a worst case power workload for the integrated circuit device by:
    performing an architectural analysis of the primitive level model that simulates transistors of the integrated circuit device; and
    deriving, as the worst case power workload, a sequence of instructions that cause the integrated circuit device to consume a maximum amount of power when executed by the integrated circuit device, based on the architectural analysis.

13. The computer program product of claim 12, wherein the computer readable program causes the computing device to perform an architectural analysis of the primitive level model further by:

analyzing an issue unit state machine of the integrated circuit device to derive at least one situation in which all pipeline stages of a pipeline of an execution unit in the integrated circuit device are utilized at a same time; and determining which portions of the execution unit consume the most power under the at least one situation by running valid instructions through the pipeline and analyzing results of running the valid instructions, wherein the sequence of instructions is derived based on the results of running the valid instructions.

14. The computer program product of claim 12, wherein the computer readable program further causes the computing device to generate a worst case power workload for the integrated circuit device by:

creating one or more data patterns to accompany the sequence of instructions, the one or more data patterns providing maximum switching of the transistors of an execution unit when the sequence of instructions is executed by the integrated circuit device.

15. The computer program product of claim 12, wherein the computer readable program further causes the computing device to generate a worst case power workload for the integrated circuit device by:

adjusting the sequence of instructions to generate a sequence of instructions having a corresponding sequence of power consumption peaks and valleys that match fundamental noise harmonics of the integrated circuit device.

16. The computer program product of claim 11, wherein the computer readable program causes the computing device to simulate the worst case power workload on a primitive level model of the integrated circuit device to generate a worst case current waveform by:

generating switching factor information for each cycle of the simulation;

generating a power consumption value for each cycle of the simulation based on the switching factor information and an average transistor power consumption per switching event value; and generating the worst case current waveform based on the power consumption value for each cycle of the simulation.

17. The computer program product of claim 16, wherein the computer readable program further causes the computing device to:

scale the worst case current waveform using a scaling factor to account for at least one of input/output related power consumption or process variability in formation of transistors.

18. The computer program product of claim 11, wherein the worst case noise value is a worst case noise budget value derived from a noise magnitude value generated by simulating the worst case current waveform on the electrical model of the integrated circuit device.

19. The computer program product of claim 11, wherein the computer readable program further causes the computing device to:

modify at least one of an architecture of the primitive level model, assumptions of noise parasitics in the electrical model, a transistor power consumed per switching operation value used to generate the worst case current waveform, or a scaling factor used to generate the worst case current waveform; and repeat the steps of claim 1 following the modification.

20. A data processing system, comprising:

a processor; and a memory coupled to the processor, wherein the memory comprises instructions which, when executed by the processor, cause the processor to:

generate a worst case power workload for an integrated circuit device;

simulate the worst case power workload on a primitive level model of the integrated circuit device to generate a worst case current waveform;

simulate the worst case current waveform on an electrical model of the integrated circuit device to generate a worst case noise value;

measure actual noise of the integrated circuit device running the worst case power workload;

compare the actual noise to the worst case noise value; and select, based on results of the comparison, the worst case current waveform for use in testing integrated circuit devices if the actual noise is within a tolerance of the worst case noise value.

* * * * *